(12) United States Patent
Seo et al.

(10) Patent No.: US 11,108,003 B2
(45) Date of Patent: *Aug. 31, 2021

(54) FLEXIBLE DISPLAY APPARATUS

(71) Applicant: SAMSUNG DISPLAY CO., LTD., Yongin-si (KR)

(72) Inventors: Taean Seo, Yongin-si (KR); Taehoon Yang, Yongin-si (KR); Boik Park, Yongin-si (KR); Kiyong Lee, Yongin-si (KR); Jinhwan Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 32 days.

This patent is subject to a terminal disclaimer.

(21) Appl. No.: 15/590,110

(22) Filed: May 9, 2017

(65) Prior Publication Data
US 2017/0331058 A1 Nov. 16, 2017

(30) Foreign Application Priority Data
May 10, 2016 (KR) ........................ 10-2016-0057129

(51) Int. Cl.
H01L 51/00 (2006.01)
G06F 3/041 (2006.01)
(Continued)

(52) U.S. Cl.
CPC ........ *H01L 51/0097* (2013.01); *G02B 5/3016* (2013.01); *G06F 3/0412* (2013.01); *G06F 3/0488* (2013.01); *G09F 9/30* (2013.01); *H01L 27/3232* (2013.01); *H01L 27/3246* (2013.01); *H01L 27/3258* (2013.01); *H01L 51/5237* (2013.01); *H01L 51/5253* (2013.01); *H01L 51/5256* (2013.01); *H01L 51/5293* (2013.01); *G06F 2203/04102* (2013.01); *H01L 2251/5338* (2013.01); *Y02E 10/549* (2013.01)

(58) Field of Classification Search
CPC .............. G02B 5/3016; H01L 51/5253; H01L 51/5256; H01L 51/5237; H01L 51/0097; H01L 51/5293; H01L 27/3246; H01L 27/3232; H01L 27/3258; H01L 2251/5338; H01L 51/0096; H01L 51/0017; H01L 51/5246; H01L 27/1244; H01L 27/1259; G09F 9/30; G06F 3/0488; G06F 3/0412; G06F 2203/04102; Y02E 10/549
USPC .................................................. 345/174, 76
See application file for complete search history.

(56) References Cited

U.S. PATENT DOCUMENTS 7,227,306 B2 * 6/2007 Park .................... H01L 27/3246
313/504
7,456,566 B2 * 11/2008 Seo ..................... H01L 51/5271
257/E29.147

(Continued)

FOREIGN PATENT DOCUMENTS

| KR | 10-2012-0098471 A | 9/2012 |
| KR | 10-2013-0127050 A | 11/2013 |
| KR | 10-2015-0059048 A | 5/2015 |

*Primary Examiner* — Jimmy H Nguyen
(74) *Attorney, Agent, or Firm* — Kile Park Reed & Houtteman PLLC

(57) ABSTRACT

A flexible display apparatus including a display substrate having a bending area that is bendable in one direction; a thin film encapsulation (TFE) layer on the display substrate; and at least one insulating dam on the display substrate, wherein the at least one insulating dam is outside the bending area.

15 Claims, 4 Drawing Sheets

(51) Int. Cl.
*H01L 51/52* (2006.01)
*G02B 5/30* (2006.01)
*G06F 3/0488* (2013.01)
*G09F 9/30* (2006.01)
*H01L 27/32* (2006.01)

(56) References Cited

U.S. PATENT DOCUMENTS

| | | | |
|---|---|---|---|
| 7,557,369 B2* | 7/2009 | Humbs | H01J 9/02 |
| | | | 257/40 |
| 7,728,510 B2* | 6/2010 | Oh | H01L 27/3276 |
| | | | 313/499 |
| 8,716,932 B2 | 5/2014 | Rappoport et al. | |
| 9,490,215 B2 | 11/2016 | Yang | |
| 10,135,025 B2* | 11/2018 | Kim | H01L 51/0096 |
| 2013/0002583 A1* | 1/2013 | Jin | G06F 1/1637 |
| | | | 345/173 |
| 2013/0300697 A1 | 11/2013 | Kim et al. | |
| 2014/0055702 A1 | 2/2014 | Park et al. | |
| 2014/0217397 A1* | 8/2014 | Kwak | H01L 27/1218 |
| | | | 257/43 |
| 2014/0218856 A1 | 8/2014 | Raff et al. | |
| 2014/0346445 A1* | 11/2014 | Cho | H01L 51/5246 |
| | | | 257/40 |
| 2017/0179432 A1* | 6/2017 | Visweswaran | H01L 51/5256 |

* cited by examiner

FLEXIBLE DISPLAY APPARATUS

CROSS-REFERENCE TO RELATED APPLICATION

Korean Patent Application No. 10-2016-0057129, filed on May 10, 2016, in the Korean Intellectual Property Office, and entitled: "Flexible Display Apparatus," is incorporated by reference herein in its entirety.

BACKGROUND

1. Field

Embodiments relate to a flexible display apparatus.

2. Description of the Related Art

Display apparatuses may be used in mobile apparatuses such as smartphones, laptop computers, digital cameras, camcorders, portable information terminals, notebooks, and tablet personal computers (PCs), or electronic devices such as desktop computers, televisions (TVs), outdoor billboards, exhibition display devices, dashboards, and head-up displays (HUDs). Recently, slimmer display apparatuses have been released.

SUMMARY

Embodiments are directed to a flexible display apparatus.

The embodiments may be realized by providing a flexible display apparatus including a display substrate having a bending area that is bendable in one direction; a thin film encapsulation (TFE) layer on the display substrate; and at least one insulating dam on the display substrate, wherein the at least one insulating dam is outside the bending area.

The display substrate may include an active area on which an image is displayed; a circuit area extending outward from the active area; and an edge area extending outward from the circuit area, the circuit area may be in the bending area, and the at least one insulating dam may be in the edge area.

The active area may have a surface defining a first plane, the edge area may have a surface defining a second plane, and the first plane may be different from the second plane.

The bending area may include a portion that is bent from the active area to the edge area.

The bending area may have a curved surface.

The at least one insulating dam is in the edge area.

The at least one insulating dam may include a plurality of insulating dams, and one insulating dam may be spaced apart from another insulating dam.

The insulating dam closest to the bending area may be spaced apart from the bending area.

The at least one insulating dam surrounds the active area.

The at least one insulating dam may have a positive taper shape.

The TFE layer may extend from the active area through the circuit area to the edge area.

The TFE layer may include at least one inorganic film; and at least one organic film, the inorganic film and the organic film are alternately stacked, and the inorganic film covers an outer surface of the insulating dam.

The flexible display apparatus may further include a thin film transistor (TFT) on the display substrate and including a semiconductor active layer, a gate electrode, a source electrode, and a drain electrode, an organic light-emitting device (OLED) on the display substrate and including a first electrode, an organic emissive layer, and a second electrode, and a plurality of insulating films on the display substrate and insulating the TFT from the OLED, wherein the at least one insulating dam is on a same layer as at least one of the plurality of insulating films.

The at least one insulating dam may include at least one of a first dam on a same layer as a protective film covering the source electrode and the drain electrode, a second dam on a same layer as a pixel defining layer defining a pixel area in which the OLED is arranged, and a third dam on a same layer as a spacer arranged around the pixel area.

The at least one insulating dam may include the first dam, the second dam, and the third dam, and the first dam, the second dam, and the third dam of the at least one insulating dam may be sequentially stacked on the display substrate.

The at least one insulating dam may include a plurality of insulating dams, and one insulating dam is spaced apart from another insulating dam.

At least one of the insulating dams continuously extends from the active area, through the bending area, and into the edge area.

The TFE layer may include at least one inorganic film; and at least one organic film, the inorganic film and the organic film are alternately stacked, and the inorganic film of the TFE layer is directly connected to an insulating film having an inorganic film above the display substrate in the edge area.

The edge area may include a portion that cuts an edge of a single display substrate.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
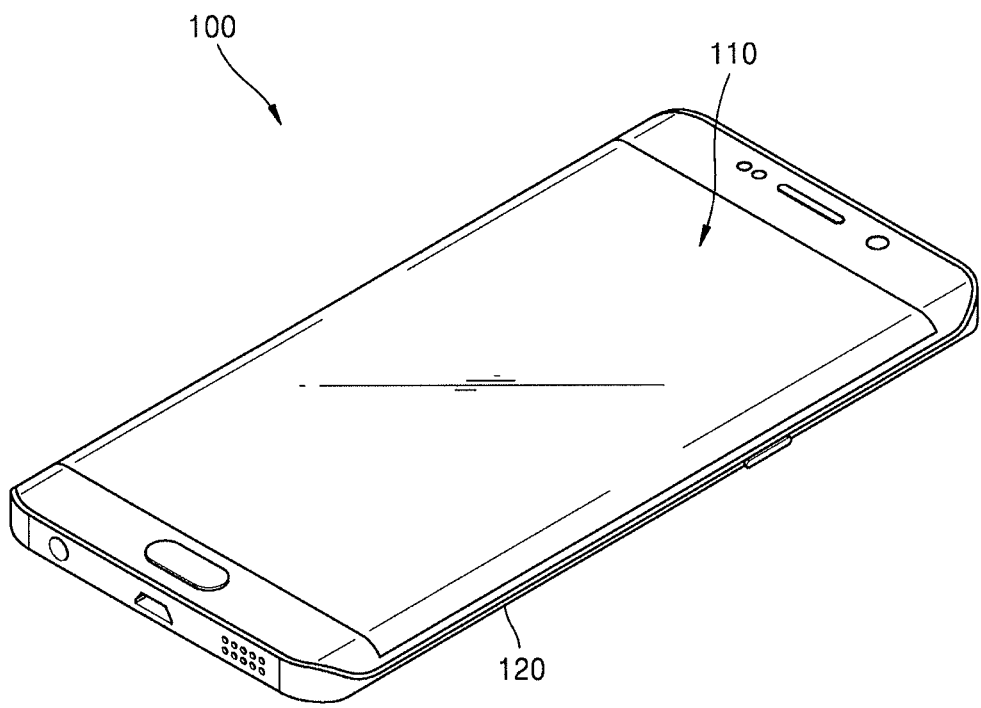
FIG. 1 illustrates a perspective view of a flexible display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout. The term "or" is not an exclusive term.

Expressions such as "at least one of" when preceding a list of elements, modify the entire list of elements and do not modify the individual elements of the list.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 illustrates a perspective view of a, e.g., flexible, display apparatus 100 according to an embodiment.

Referring to FIG. 1, the flexible display apparatus 100 may include a flexible display panel 110 and a housing 120 accommodating the flexible display panel 110. The flexible display panel 110 may be an organic light-emitting display. At least one edge of the flexible display panel 110 may be bendable or bent. The flexible display panel 110 may include a display substrate and various films, e.g. a sealing portion, a touch sensor (touch screen), a polarizing layer, and a cover window.

Figure 2:
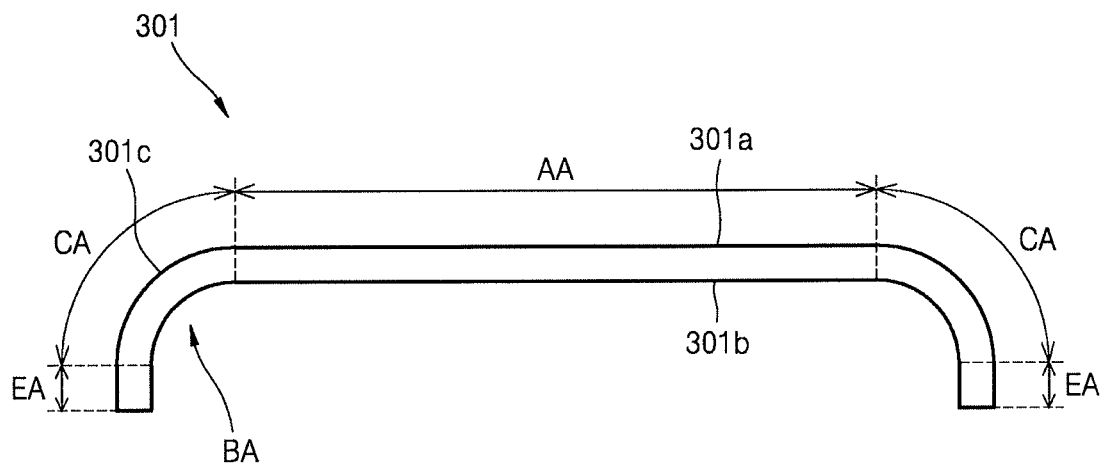
FIG. 2 illustrates a cross-sectional view of a display substrate according to an embodiment.
Figure 3:
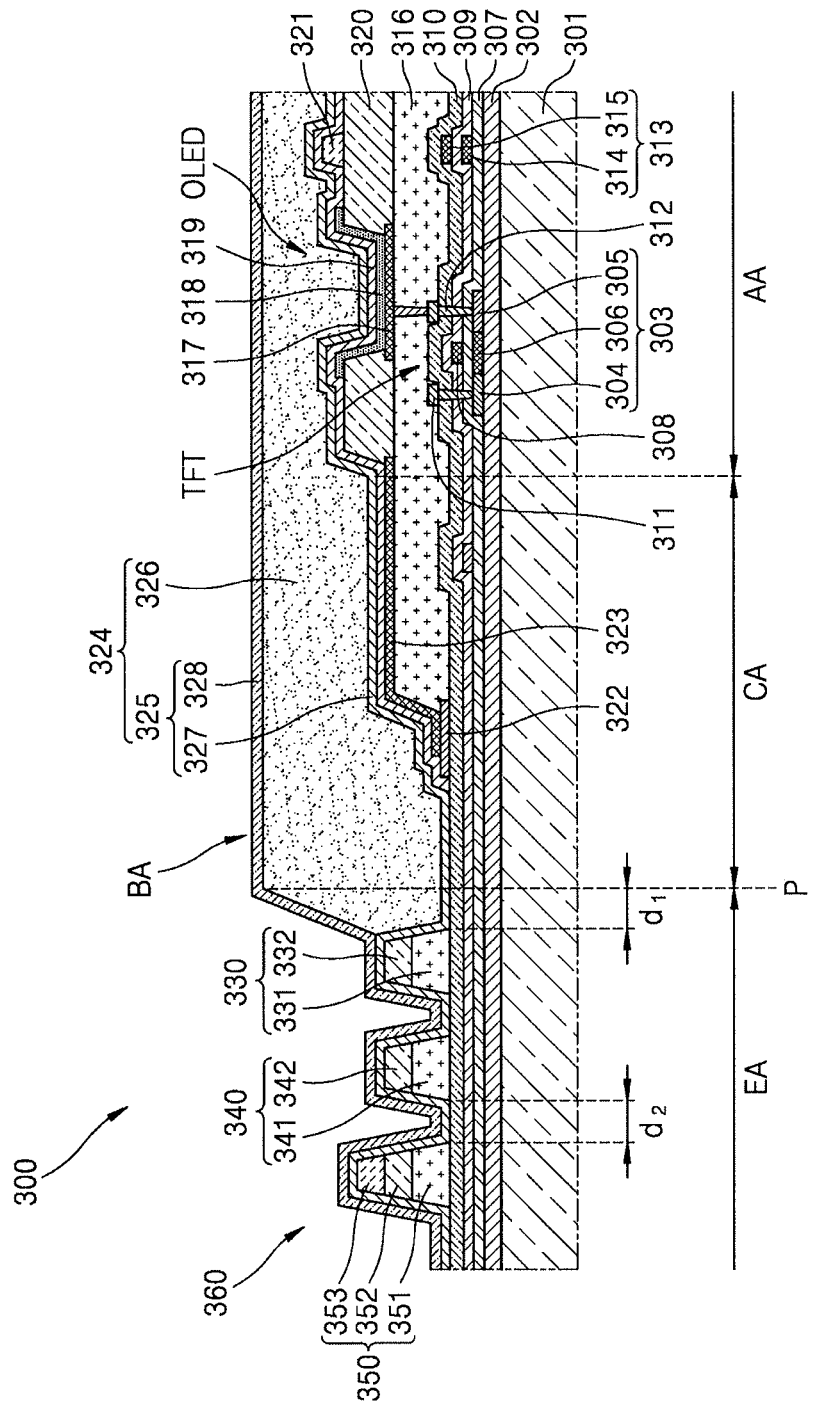
FIG. 3 illustrates a partial cut-away cross-sectional view of a flexible display panel including the display substrate of FIG. 2.

FIG. 2 illustrates a cross-sectional view of a display substrate 301 according to an embodiment. FIG. 3 illustrates a partial cut-away cross-sectional view of a flexible display panel 300 including the display substrate 301 of FIG. 2.

Referring to FIGS. 2 and 3, the flexible display panel 300 may include the display substrate 301 and a thin film encapsulation (TFE) layer 324 on the display substrate 301.

The display substrate 301 may have a first surface 301a (on which an image is displayed) and a second surface 301b opposite the first surface 301a. The display substrate 301 may include a bending area BA that is bent in at least one direction. In an implementation, both edges of the display substrate 301 may be bent at a certain angle. The bending area BA may include a curved surface 301c.

The display substrate 301 may include an active area (AA) on which an image is displayed, a circuit area CA extending outwardly from the active area (AA), and an edge area EA extending outwardly from the circuit areas CA.

A plurality of devices for displaying an image may be arranged in the active area AA. Circuit lines electrically connected to the devices in the active area AA may be arranged in the circuit area CA. In an implementation, the circuit area CA may be arranged in the bending area BA. The edge area EA may include a portion that cuts an edge of the single display substrate 301 used in one display apparatus.

In an implementation, the active area AA and the edge area EA may be arranged in different directions, e.g., a surface of the active area AA may be on a plane that is different from a plane of a surface of the edge area EA. For example, the active area AA may be arranged in a first direction (that is a horizontal direction of the display substrate 301 in FIG. 2), and the edge area EA may be arranged in a second direction (that is a vertical direction of the display substrate 301 in FIG. 2). For example, the plane of the surface of the active area AA may be perpendicular to the plane of the surface of the edge area EA. The active area AA and the edge area EA may be connected to each other by the bending area BA (in the circuit area CA). In an implementation, the bending area BA may include a portion bent from the first direction to the second direction, e.g., the bending area may connect the flat active area AA with the flat edge area EA via a curved section of the display substrate 301.

The display substrate 301 may be a glass substrate, a polymer substrate, a flexible film, a metal substrate, or a composite substrate thereof. The display substrate 601 may be transparent, semitransparent, or opaque. The display substrate 301 may have flexibility.

In an implementation, the display substrate 301 may include a polymer material, e.g., polyimide (PI), polycarbonate (PC), polyethersulphone (PES), polyethylene terephthalate (PET), polyethylenenaphthalate (PEN), polyarylate (PAR), or fiber glass reinforced plastic (FRP).

A barrier film 302 may be on the display substrate 301. The barrier film 302 may cover a surface, e.g., an upper surface, of the display substrate 301. The barrier film 302 may be an inorganic film or an organic film. The barrier film 302 may be a single-layered film or a multi-layered film.

In the active area AA, at least one thin-film transistor (TFT) may be on the barrier film 302.

A semiconductor active layer 303 may be on the barrier film 302.

The semiconductor active layer 303 may include a source region 304 and a drain region 305 arranged by doping N-type impurity ions or P-type impurity ions. A channel region 306, into which impurities are not doped, may be defined between the source region 304 and the drain region 305. The semiconductor active layer 303 may be an organic semiconductor, an inorganic semiconductor, or an amorphous silicon. In an implementation, the semiconductor active layer 303 may be an oxide semiconductor.

A first gate insulating film 307 may be on the semiconductor active layer 303. The first gate insulating film 307 may be an inorganic film. The first gate insulating film 307 may be a single-layered film or a multi-layered film.

A gate electrode 308 may be on the first gate insulating film 307. The gate electrode 308 may include a metallic material having excellent conductivity. The gate electrode 308 may be a single-layered film or a multi-layered film.

A second gate insulating film 309 may be on the gate electrode 308. The second gate insulating film 309 may be an inorganic film. The second gate insulating film 309 may be a single-layered film or a multi-layered film. In an implementation, the TFT may include a plurality of gate electrodes respectively on different gate insluting layers 307 and 309.

An interlayer insulating film 310 may be on the second gate insulating film 309. The interlayer insulating film 310 may be an inorganic film.

A source electrode 311 and a drain electrode 312 may be on the interlayer insulating film 310. The source electrode 311 and the drain electrode 312 may be connected to the semiconductor active layer 303 through a contact hole. For example, the source electrode 311 may be electrically connected to the source region 304, and the drain electrode 312 may be electrically connected to the drain region 305. The source electrode 311 and the drain electrode 312 may include a single metal, an alloy, metal nitride, conductive metal oxide, or a transparent conductive material.

A capacitor 313 may be on the display substrate 301. A first capacitor electrode 314 may be on the first gate insulating film 307. A second gate insulating film 309 may be on the first capacitor electrode 314. A second capacitor electrode 315 may be on the second gate insulating film 309.

A protective film 316 may be on the TFT and the capacitor 313. The protective film 316 may cover the TFT and the capacitor 313. The protective film 316 may be an inorganic film or an organic film. The protective film 316 may be a passivation film or a planarization film.

The TFT may be electrically connected to an organic light-emitting device (OLED). The OLED may include a first electrode 317, an intermediate layer 318, and a second electrode 319.

The first electrode 317 may be on the protective film 316. The first electrode 317 may function as an anode and may include various conductive materials. The first electrode 317 may include a transparent electrode or a reflective electrode. For example, when the first electrode 317 is used as the transparent electrode, the first electrode 317 may include a transparent conductive film. When the first electrode 317 is used as the reflective electrode, the first electrode 317 may include a reflective film and a transparent conductive film on the reflective film.

A pixel defining layer 320 may be on the protective film 316. The pixel defining layer 320 may cover a part of the first electrode 317. The pixel defining layer 320 may surround an edge of the first electrode 317 to define an emission region of each sub-pixel. The first electrode 317 may be patterned in each sub-pixel.

The pixel defining layer 320 may be an organic film or an inorganic film. The pixel defining layer 320 may be a single-layered film or a multi-layered film.

The intermediate layer 318 may be on a region at which the first electrode 317 is exposed (by etching a part of the pixel defining layer 320).

The intermediate layer 318 may include an organic emissive layer.

In an implementation, the intermediate layer 318 may include an organic emissive layer and may further include, e.g., a hole injection layer (HIL), a hole transport layer (HTL), an electron transport layer (ETL), or an electron injection layer (EIL).

In an implementation, the intermediate layer 318 may include an organic emissive layer and may further include various functional layers.

The second electrode 319 may be on the intermediate layer 318. The second electrode 319 may function as a cathode. The second electrode 319 may be a common electrode. The second electrode 319 may include a transparent electrode or a reflective electrode. For example, when the second electrode 319 is used as the transparent electrode, the second electrode 319 may include a conductive layer including a metal having a low work function or a compound thereof, and a transparent conductive film on the conductive layer. When the second electrode 319 is used as the reflective electrode, the second electrode 319 may include a conductive layer including a metal and a compound thereof.

A spacer 321 may be arranged around the sub-pixel above the pixel defining layer 320. The spacer 321 may be between adjacent sub-pixels.

In an implementation, a plurality of sub-pixels may be on the display substrate 301. For example, a red color, a green color, a blue color, or a white color may be produced according to each sub-pixel.

Various circuit lines may be in the circuit area CA. For example, power supply patterns, electrostatic discharge prevention patterns, and various circuit patterns may be arranged in the circuit area CA.

A power line 322 may be on the interlayer insulating film 310. The power line 322 may be a line to which external power is supplied. The power line 322 may include a same material as the source electrode 311 and the drain electrode 312. In an implementation, the power line 322 may have a three-layered structure of titanium/aluminum/titanium (Ti/Al/Ti).

The circuit line 323 may be on the protective film 316. The circuit line 323 may include a same material as the first electrode 317.

The power line 322 and the circuit line 323 may be on different layers. A part of the circuit line 323 may overlap the power line 322. One end of the second electrode 319 may be on the circuit line 323. In an implementation, one end of the second electrode 319 may cover a portion in which the power line 322 and the circuit line 323 are connected to each other.

The TFE layer 324 may be on the display substrate 301.

The TFE layer 324 may extend from the active area AA through the circuit area CA to the edge area EA. For example, the TFE layer 324 may include at least one inorganic film 325 and at least one organic film 326. In an implementation, the TFE layer 324 may include a first inorganic film 327, the organic film 326, and a second inorganic film 328, which are alternately stacked. In an implementation, the inorganic film 325 may extend from the active area AA to the edge area EA.

When the organic film 326 of the TFE layer 324 is formed on the display substrate 301, a liquid organic material could undesirably flow toward an unintended area of the display substrate 301. In order to help reduce the possibility of such a phenomenon, an insulating dam 360 having at least one layer may be included on the display substrate 301. The insulating dam 360 may be arranged around, e.g., may extend around or surround, the active area AA.

The insulating dam 360 may be arranged outside the bending area BA. As described above, the bending area BA may be an area in which the flexible display panel 300 is bent in one direction. In the insulating dam 360, a dam width may be narrow and an angle of an inclined surface may be large. If the insulating dam 360 were to be included in the bending area BA, the insulating dam 360 could be vulnerable to stress at the time of bending. Accordingly, a crack could occur in the insulating dam 360.

In an implementation, the insulating dam 360 may be included in the edge area EA (e.g., that extends outwardly from the bending area BA).

At least one insulating dam 360 may be included in the edge area EA. In an implementation, the insulating dam 360 may include, e.g., a first insulating dam 330, a second insulating dam 340, and a third insulating dam 350, which are spaced apart from one another. A number of insulating dams 360 may be a suitable number as long as the insulating dams 360 are able block the flow of the liquid organic material. The first insulating dam 330, the second insulating dam 340, and the third insulating dam 350 may surround the active area AA.

In an implementation, the first insulating dam 330 (closest to the bending area BA) may be in the edge area EA and spaced a distance d1 from an end point P of the bending area BA. The distance d1 may be an alignment tolerance required for bending the flexible display panel 300. In an implementation, the distance d1 may be about 200 micrometers or more.

In an implementation, the insulating dam 360 may have a positive taper shape. In an implementation, a taper angle of the insulating dam 360 may be about 70 degrees or less.

A distance between the first insulating dam 330 and the second insulating dam 340 and a distance between the second insulating dam 340 and the third insulating dam 350 may be d2. In an implementation, the distance d2 may be about 50 micrometers or more.

Each of the first insulating dam 330, the second insulating dam 340, and the third insulating dam 350 may be a single layer structure or a multi-layer structure. The first insulating dam 330, the second insulating dam 340, and the third insulating dam 350 may have the same stacked structure or different stacked structures. The first insulating dam 330, the second insulating dam 340, and the third insulating dam 350 may be stacked in a vertical direction of the display substrate 301, e.g., may be stacked in a direction away from the display substrate 301.

For example, the first insulating dam 330 may include a first dam 331 on the interlayer insulating film 310 and a second dam 332 on the first dam 331. The first dam 331 may be on a same layer as the protective film 316. The first dam 331 may be formed in a same process as the protective film 316 and may include the same material as the protective film 316. The second dam 332 may be on a same layer as the pixel defining layer 320. The second dam 332 may be formed in a same process as the pixel defining layer 320 and may include the same material as the pixel defining layer 320.

The second insulating dam 340 may include a first dam 341 on the interlayer insulating film 310 and a second dam 342 on the first dam 341. The first dam 341 may be on the same layer as the protective film 316. The second dam 342 may be arranged on the same layer as the pixel defining layer 320.

The third insulating dam 350 may include a first dam 351 on the interlayer insulating film 310, a second dam 352 on the first dam 351, and a third dam 353 on the second dam 352. The first dam 351 may be on the same layer as the protective film 316. The second dam 352 may be on the same layer as the pixel defining layer 320. The third dam 353 may be on a same layer as the spacer 321. For example, the third dam 353 may be formed in a same process as the spacer 321 and may include a same material as the spacer 321.

The inorganic film 325 of the TFE layer 324 may cover an outer surface of each of the first insulating dam 330, the second insulating dam 340, and the third insulating dam 350 in the edge area EA. The inorganic film 325 may cover the outer surface of the first insulating dam 330, the outer surface of the second insulating dam 340, the outer surface of the third insulating dam 350, a region between the end point P of the bending area BA and the first insulating dam 330, a region between the first insulating dam 330 and the second insulating dam 340, a region between the second insulating dam 340 and the third insulating dam 350, and a region between the third insulating dam 350 and the outermost portion of the edge area EA.

As such, elements (e.g., the insulating dam 360) vulnerable to stress at the time of bending may be arranged outside the bending area BA, and the reliability of an out bending type flexible display panel 300 may be ensured.

In an implementation, in addition to the insulating dam 360, elements or components vulnerable to bending may not be arranged in the bending area BA.

In an implementation, a display area on which an image is displayed may not be arranged in the bending area BA.

In an implementation, when a length of the bending area BA is less than a length of the circuit area CA, a contact portion, in which the power line 322 is connected to the circuit line 323, or the like may be outside the bending area BA.

Figure 4:
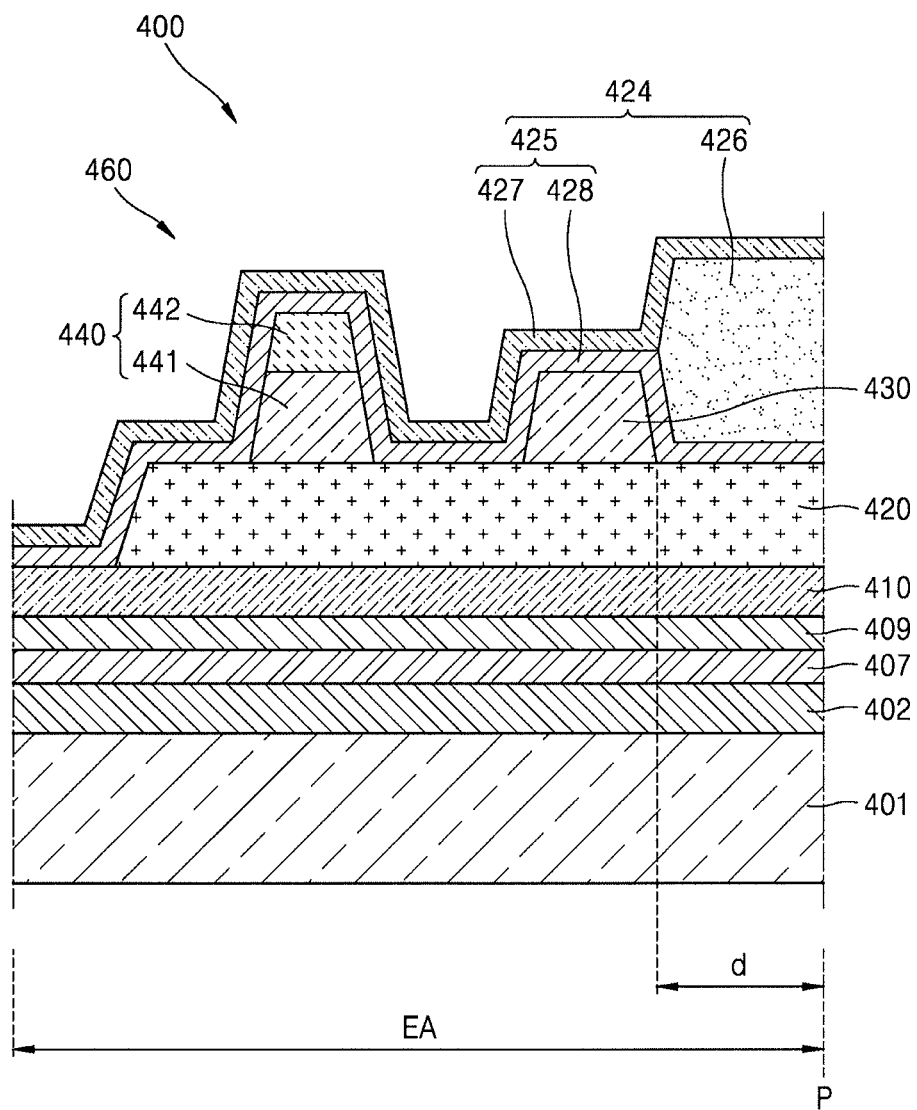
FIG. 4 illustrates an enlarged cross-sectional view of an edge area of a flexible display panel according to another embodiment.

FIG. 4 illustrates an enlarged cross-sectional view of an edge area EA of a flexible display panel 400 according to another embodiment.

Referring to FIG. 4, a plurality of insulating layers 402, 407, 409, and 410 may be on a display substrate 401. For example, the barrier film 402 may be on the display substrate 401. The first gate insulating film 407 may be on the barrier film 402. The second gate insulating film 409 may be on the first gate insulating film 407. The interlayer insulating film 410 may be on the second gate insulating film 409.

A common dam 420 may be on the interlayer insulating film 410. The common dam 420 may be on the same layer as the protective film 316 of FIG. 3, such as a passivation film or a planarization film. Unlike the first dams 331, 341, and 351 of FIG. 3, the common dam 420 may integrally extend to the edge area EA. For example, a continuous piece of the, e.g., protective film 316, may extend from the active area AA all the way to the edge area EA.

An insulating dam 460 (having at least one layer) may be on the common dam 420. The insulating dam 460 may include a first insulating dam 430 and a second insulating dam 440 on the common dam 420.

The first insulating dam 430 may be on the same layer as the pixel defining layer 320 of FIG. 3. In an implementation, the first insulating dam 430 may be in the edge area EA and spaced a distance d from an end point P of the bending area BA.

The second insulating dam 440 may include a first dam 441 on the common dam 420, and a second dam 442 on the first dam portion 441. The first dam 441 may be on the same layer as the pixel defining layer 320 of FIG. 3. The second dam 442 may be on the same layer as the spacer 321 of FIG. 3.

A TFE layer 424 may be on the display substrate 401. The TFE layer 424, e.g., inorganic films of the TFE layer 424, may extend over the entire edge area EA. The TFE layer 424 may include at least one inorganic film 425 and at least one organic film 426. In an implementation, the TFE layer 424 may include a first inorganic film 427, the organic film 426, and a second inorganic film 428, which are alternately stacked. In an implementation, the inorganic film 425 may cover an outer surface of the first insulating dam 430 and an outer surface of the second insulating dam 440. A portion of the organic film 426 may extend into the edge area EA FIG. 5 illustrates an enlarged cross-sectional view of an edge area EA of a flexible display panel 500 according to another embodiment.

Figure 5:
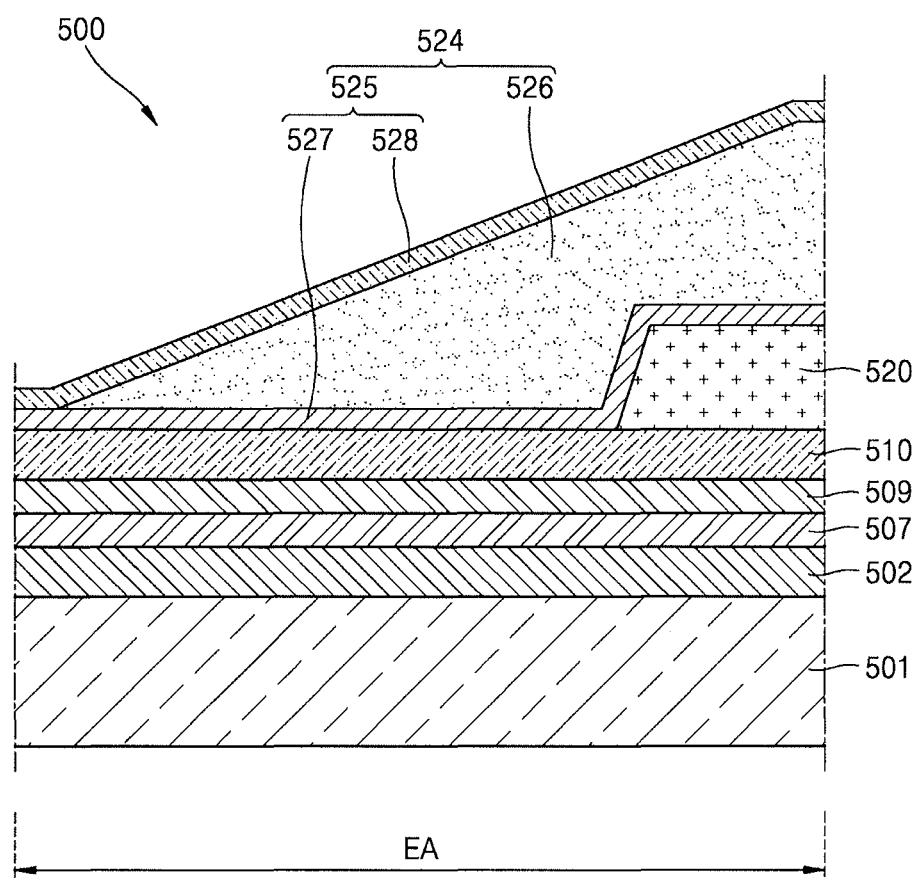
FIG. 5 illustrates an enlarged cross-sectional view of an edge area of a flexible display panel according to another embodiment.

Referring to FIG. 5, a plurality of insulating layers 502, 507, 509, and 510 may be on a display substrate 501. For example, the barrier film 502 may be on the display substrate 501. The first gate insulating film 507 may be on the barrier film 502. The second gate insulating film 509 may be on the first gate insulating film 507. The interlayer insulating film 510 may be on the second gate insulating film 509. At least a part of a common dam 520 may be on the interlayer insulating film 510 (e.g., in the edge area EA). The insulating dam 520 may be on the same layer as the protective film 316 of FIG. 3, such as a passivation film or a planarization film.

A TFE layer 524 may be on the display substrate 501. The TFE layer 524 may extend over the entire edge area EA. The TFE layer 524 may include at least one inorganic film 525 and at least one organic film 526. In an implementation, the TFE layer 524 may include a first inorganic film 527, the organic film 526, and a second inorganic film 528, which are alternately stacked.

In the edge area EA, the first inorganic film 527 may be directly connected to the interlayer insulating film 510 including an inorganic film. A portion that connects the first inorganic film 527 to the interlayer insulating film 510 may be arranged in the edge area EA, and a crack of the flexible display panel 300 in the bending area BA may be prevented.

By way of summation and review, flexible display devices are easy to carry and may be applicable to apparatuses having various shapes. Among them, a flexible display apparatus based on organic light-emitting display technology may be the most powerful. The flexible display apparatus may be bent in, e.g., one direction.

The embodiments may provide a flexible display apparatus that is easily bendable.

According to one or more embodiments, the insulating dam may be arranged outside the bending area, and the flexible display apparatus may help reduce a stress applied to the bending area.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A flexible display apparatus, comprising:
a display substrate having an active area on which an image is displayed, a bending area extending outward from the active area and that is bendable in one direction, and an edge area extending outward from the bending area;
a thin film encapsulation (TFE) layer on the display substrate and including a first inorganic layer, an organic layer, and a second inorganic layer, the first inorganic layer and the second inorganic layer extending from the active area to the edge area;
a thin film transistor (TFT) on the display substrate and including a semiconductor active layer, a gate electrode, a source electrode, and a drain electrode;
an organic light-emitting device (OLED) on the display substrate and including a first electrode, an organic emissive layer, and a second electrode;
a pixel defining layer comprising an organic material and covering an edge of the first electrode;
a spacer on the pixel defining layer;
an insulating protective film disposed directly at a bottom surface of the first electrode, covering the source electrode and the drain electrode of the TFT, and insulating the TFT from the OLED; and
at least one insulating dam on the display substrate,
wherein the at least one insulating dam is in the edge area,
wherein the at least one insulating dam includes a plurality of layers, the plurality of layers including a first layer formed of a same material as the insulating protective film, a second layer formed of a same material as the pixel defining layer, and a third layer formed of a same material as the spacer,
wherein the insulating protective film and the first layer of the at least one insulating dam formed of the same material as the insulating protective film are both directly on an interlayer insulating film that is away from the first electrode and covers the gate electrode of the TFT, and wherein the first inorganic layer and the second inorganic layer cover an outer surface of an outermost dam of the at least one insulating dams.

2. The flexible display apparatus as claimed in claim 1, wherein:
the display substrate includes a circuit area extending outward from the active area, and
the circuit area is in the bending area.

3. The flexible display apparatus as claimed in claim 2, wherein:
the active area has a surface defining a first plane,
the edge area has a surface defining a second plane, and
the first plane is different from the second plane.

4. The flexible display apparatus as claimed in claim 3, wherein the bending area includes a portion that is bent from the active area to the edge area.

5. The flexible display apparatus as claimed in claim 4, wherein the bending area has a curved surface.

6. The flexible display apparatus as claimed in claim 2, wherein the at least one insulating dam is in the edge area.

7. The flexible display apparatus as claimed in claim 6, wherein:
the at least one insulating dam includes a plurality of insulating dams, and
one insulating dam is spaced apart from another insulating dam.

8. The flexible display apparatus as claimed in claim 7, wherein the insulating dam closest to the bending area is spaced apart from the bending area.

9. The flexible display apparatus as claimed in claim 2, wherein the at least one insulating dam extends around one or more of the active area and the circuit area.

10. The flexible display apparatus as claimed in claim 2, wherein the at least one insulating dam has a positive taper shape.

11. The flexible display apparatus as claimed in claim 2, wherein the TFE layer extends from the active area through the circuit area to the edge area.

12. The flexible display apparatus as claimed in claim 11, wherein:
the TFE layer includes:
at least one inorganic film; and
at least one organic film,
the inorganic film and the organic film are alternately stacked, and
the inorganic film covers an outer surface of the at least one insulating dam.

13. The flexible display apparatus as claimed in claim 2, wherein:
the layer of the at least one insulating dam formed of the same material as the insulating protective film is a first dam of the at least one insulating dam, and
the at least one insulating dam further includes at least one of:
a second dam, the second dam and the pixel defining layer, which defines a pixel area in which the OLED is arranged, being on a same layer, and
a third dam, the third dam and the spacer, which is arranged around the pixel area, being on a same layer.

14. The flexible display apparatus as claimed in claim 13, wherein:
the at least one insulating dam includes the first dam, the second dam, and the third dam, and
the first dam, the second dam, and the third dam of the at least one insulating dam are sequentially stacked on the display substrate.

15. The flexible display apparatus as claimed in claim 13, wherein
- the at least one insulating dam includes a plurality of insulating dams, and
- one insulating dam is spaced apart from another insulating dam.

* * * * *